(12) United States Patent
Hong et al.

(10) Patent No.: US 6,828,524 B2
(45) Date of Patent: Dec. 7, 2004

(54) METHOD AND APPARATUS FOR CLEANING INKJET CARTRIDGES

(75) Inventors: Minghui Hong, Singapore (SG); Wen Dong Song, Singapore (SG); Yongfeng Lu, Singapore (SG)

(73) Assignee: Data Storage Institute (SG)

( * ) Notice: Subject to any disclaimer, the term of this patent is extended or adjusted under 35 U.S.C. 154(b) by 238 days.

(21) Appl. No.: 10/083,832

(22) Filed: Feb. 27, 2002

(65) Prior Publication Data

US 2003/0048329 A1 Mar. 13, 2003

(30) Foreign Application Priority Data

Sep. 10, 2001 (SG) ....................................... 200105516-9

(51) Int. Cl.$^7$ .............................................. B23K 26/00
(52) U.S. Cl. ................................ 219/121.6; 219/121.83
(58) Field of Search ........................ 219/121.6, 121.81, 219/121.82, 121.83

(56) References Cited

U.S. PATENT DOCUMENTS

| | | | |
|---|---|---|---|
| 5,319,183 A | | 6/1994 | Hosova et al. |
| 5,592,879 A | * | 1/1997 | Waizmann ............... 101/416.1 |
| 5,864,114 A | | 1/1999 | Fukuda |
| 6,120,976 A | * | 9/2000 | Treadwell et al. .......... 430/322 |
| 6,312,103 B1 | * | 11/2001 | Haluzak ..................... 347/45 |

FOREIGN PATENT DOCUMENTS

JP 11114690 4/1999

OTHER PUBLICATIONS

Journal of Applied Physics, vol. 85, No. 5, Mar. 1, 1999; Laser Plasma Interaction at an Early Stage of Laser Ablation; 5 pages.
Journal of Applied Physics, vol. 79, No. 5, Mar. 1, 1996; Audible Acoustic Wave Emission in Excimer Laser Interaction with Materials; 6 pages.

* cited by examiner

Primary Examiner—M. Alexandra Elve
(74) Attorney, Agent, or Firm—Coats & Bennett, P.L.L.C.

(57) ABSTRACT

This invention relates to a method and apparatus for removing surface contamination on a flexible circuit 34 for an inkjet printer cartridge by pulsed laser irradiation in air. The contamination 3 around and inside the tiny inkjet nozzles 4 can be completely removed without any damage on the flexible circuit 34 by the laser irradiation. The cleaning mechanisms are laser-induced ablation of the contamination and fast momentum transferring from the laser beam to the contamination materials. Compared with chemical solution cleaning and plasma etching, this technique has high throughput and does not cause flexible circuit damage, due to the fact that there are no water and chemical solutions involved in the process. Meanwhile, the laser irradiation is only limited in a small area around the tiny inkjet nozzles 4. There is no laser interaction with the thin conductive circuit 34.

30 Claims, 7 Drawing Sheets

METHOD AND APPARATUS FOR CLEANING INKJET CARTRIDGES

The invention relates to a method and apparatus for cleaning inkjet cartridges in particular using pulsed laser irradiation.

It is a conventional technique in manufacturing inkjet cartridges to drill tiny inkjet nozzles (for example, diameter around 40 μm for 2400 dpi inkjet printers) on the polyimide-based flexible circuit by ultra-violet (UV) laser ablation. During the laser drilling, polyimide debris generated will be distributed between the top transparent layer and polyimide substrate. It results in the deposition of black contamination materials around and inside the tiny inkjet nozzles. The contamination affects printing quality subsequently due to improper ink accuracy and poor flexible circuit contact with other device components. Accordingly an important issue in manufacturing the cartridges is to enhance the printer performance by removing surface contamination before the cartridge assembly. As printer technology develops, the tiny inkjet nozzles become smaller and smaller This makes the contamination removal even more critical. There are two available methods to remove the contamination: chemical solution cleaning, and plasma etching.

In the case of chemical solution cleaning, the flexible circuit is put into an appropriate cleaning chemical solution for a certain period of time until the contamination is completely etched away. The flexible circuit is then rinsed by de-ionized (DI) water and dried in a subsequence process.

This gives rise to certain problems. High cost and subsequent drying of the flexible circuit are the main drawbacks of this technology. When the chemical solutions etch away the contamination, a chemical reaction with the polyimide substrate materials can also take place, damaging the substrate. The chemical solution can also be corrosive to the thin conductive circuit on the polyimide substrate. Meanwhile, the flexible circuit has to be dried in the subsequent process after the cleaning, which increases the production cost and processing time, introducing a lower yield. Furthermore, maintenance and disposal of the chemical solutions increase the manufacturing cost as a result of environment protection overheads.

In the plasma etching approach, the flexible circuit is put inside a vacuum chamber and then irradiated by a plasma generated from a plasma source. Surface contamination is then removed due to the plasma interaction with the contamination materials. Contamination debris generated during the plasma etching can be taken away by a gas stream or with a sucker system. This technique also has several problems. The processing needs sophisticated equipment to provide a stable plasma source. In addition, it must be carried out in a vacuum, which increases the cost and manufacturing time. Plasma can etch away not only the contamination but also the polyimide substrate. Furthermore, the thin conductive circuit may be damaged inside the plasma atmosphere.

Though the two methods mentioned above have cleaning effects on the surface contamination, the associated disadvantages significantly affect the productivity of the contamination removal and the reliability of the flexible circuit in manufacturing and increase environment protection overheads.

It is an object of the invention to overcome or mitigate at least some of the above problems. According to the invention there is provided an inkjet circuit cleaning apparatus comprising a circuit holder, a laser for generating a laser beam and an optics subsystem arranged to focus the laser beam onto a circuit surface at the circuit holder.

The optics subsystem preferably includes a beam splitter for splitting off a portion of the beam to regulate the laser beam power The optics subsystem preferably includes a lens system made of two cylinder lenses for changing a circular laser beam into a narrow and long laser beam, which adjusts the laser beam size, shape and fluence on the flexible circuit.

The optics subsystem preferably includes a galvanometer arranged to scan the laser beam across a circuit surface.

The apparatus preferably further includes a diagnostic subsystem comprising a sensor arranged to sense whether the circuit surface has been cleaned, and preferably the sensor comprises one or more of an acoustic sensor, a plasma signal sensor or a surface pattern inspection monitor. The apparatus preferably further includes an apparatus controller arranged to receive a signal from the sensor and control the cleaning operation accordingly.

The laser preferably has a pulse duration of nanoseconds and a wavelength selected from the visible to the infrared range. For example the laser may be a YAG laser with a wavelength 1064 nm or 532 nm.

The laser beam more preferably has as at least one of the following characteristics: pulse duration 7 nano-seconds; wavelength 532 nm; fluence of 50 mJ/cm$^2$; pulse number of 10.

Preferably the circuit holder is arranged to replace a cleaned circuit by a contaminated circuit.

The apparatus preferably further includes a contaminant removal mechanism, and preferably the contaminant removal mechanism comprises one of a vacuum source or a gas stream source, and the apparatus preferably further comprises a transparent protective cover between the circuit holder and the optics system to trap escaped contaminant.

Preferably the circuit comprises a flexible circuit for an inkjet printer cartridge. According to the invention there is further provided a method of cleaning an inkjet circuit comprising the steps of retaining a circuit to be cleaned in a circuit holder, generating a laser beam from a laser, and focusing and scanning the laser beam on the circuit surface via an optics subsystem.

The method preferably further comprises the steps of detecting when a portion of the circuit surface is cleaned and controlling the galvanometer to scan the beam across a non-cleaned portion of the surface.

The method preferably further comprises the step of detecting when a circuit is fully cleaned, and controlling the circuit holder to replace the circuit with a non-cleaned circuit.

The method is preferably for cleaning a flexible circuit of an inkjet printer cartridge.

As a result a dry process is available, in air, which does not need the sophisticated equipment and subsequent rinsing and drying process. There are also no chemical solutions involved. By proper control of the processing parameters, the laser irradiation can remove the contamination completely without any damage on the polyimide substrate and the thin conductive circuit. This invention can accordingly offer high productivity and low cost.

In the preferred embodiment appropriate processing parameters such as light wavelength, laser pulse duration, laser fluence and pulse number are selected for removal of the contamination. The contamination area on the polyimide substrate is selectively irradiated by the pulsed laser with the proper processing parameters. When the laser energy is absorbed, its photon energy can easily break the loose chemical bonds of the contamination. It induces a photo-ablation effect with the weak and localised plasma generation. At the same time, the fast momentum transferring from the laser beam to the polyimide substrate induces the rapid vibration of the substrate surface. It results in the contamination debris ejecting out of the irradiated surface at a high speed. With a gas stream or sucker system, the contamination debris can be easily taken away. In this process, laser fluence can be a critical parameter. With the applied suitable laser fluence, the laser irradiation can remove the contamination completely without any damage on the polyimide substrate. Furthermore, the laser irradiation is limited to around the tiny inkjet nozzle area. There is no laser interaction with the thin conductive circuit Therefore, the chemical solution cleaning and plasma etching methods can be replaced by this technology. By using a suitable laser source and proper design of the laser processing parameters, it can achieve the goal of complete removal of the contamination without causing any damage on the polyimide substrate and the thin conductive circuit. Since it is a dry process, the disadvantages of high cost, low yield and chemical disposal can also be avoided.

An embodiment of the invention will now be described, by way of example, with reference to the drawings, of which.

Figure 1:
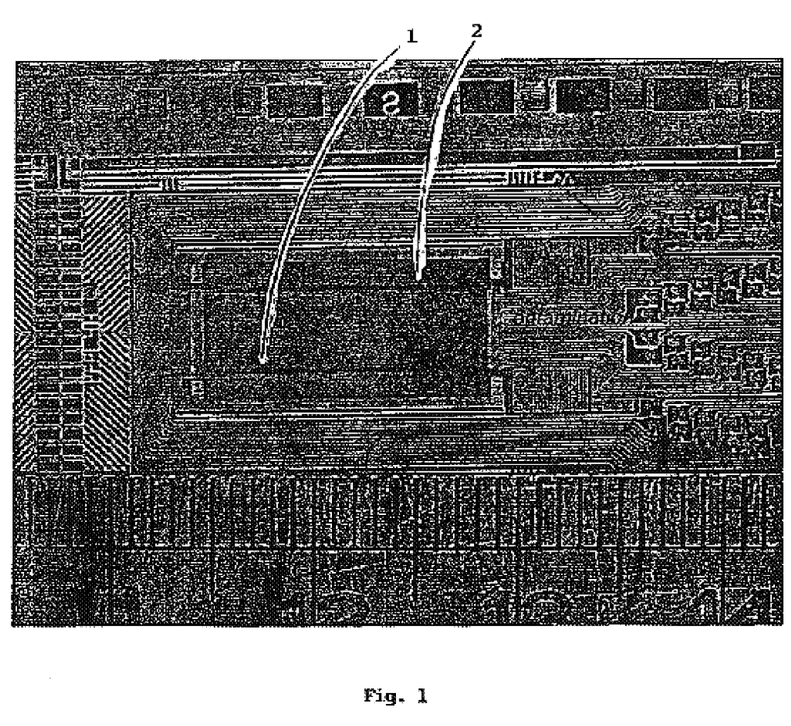
FIG. 1 is an image of a flexible circuit showing contamination.
Figure 2:
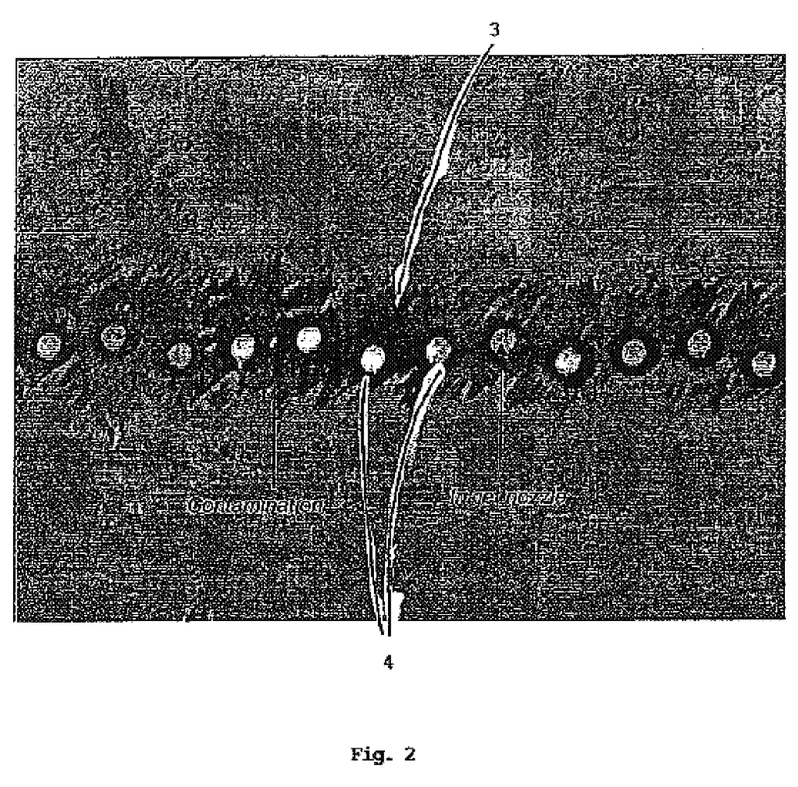
FIG. 2 is a magnified image of the contamination area of FIG. 1.

FIG. 1 shows an image of a flexible circuit with surface contamination on the polyimide substrate before the laser irradiation. In this picture, the dark lines (1,2) the contamination area. There is a large number of tiny inkjet nozzles in this area, as can be seen from FIG. 2 which shows a magnified image of the surface contamination area on the flexible circuit. In this picture, it can be observed that the dark contamination (3) is distributed around and inside the tiny inkjet nozzles (4).

Figure 3A:
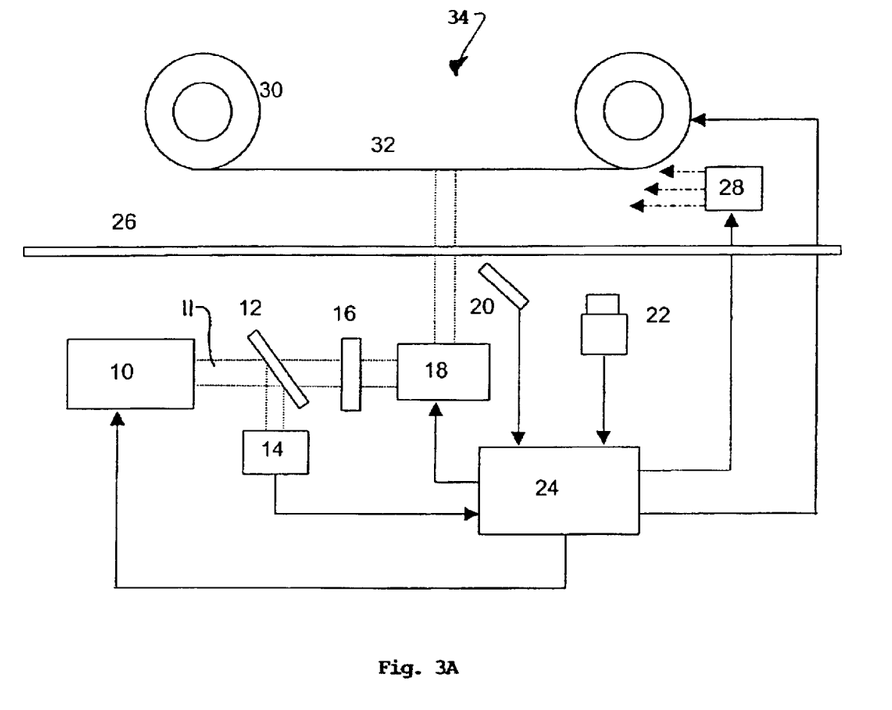
FIG. 3A is a schematic diagram of a cleaning apparatus according to the present invention.

FIG. 3A shows a schematic diagram of a laser irradiation system according to the present invention arranged to remove the surface contamination on the flexible circuit for inkjet printer cartridge. A pulsed laser (10) (for example, a Nd:YAG laser with pulse duration of 7 ns and wavelength of 1064 nm or 532 nm) provides a pulse energy output for removing contamination on the flexible circuit for inkjet printer cartridge. The laser beam (11) emitted by the laser source (10) passes through a beam sampler (12) which can be a partially silvered mirror with, say 95% transmissivity and 5% reflectivity.

A small amount of the laser energy (5%) is therefore reflected onto an energy meter (14) such that the laser pulse energy is monitored in real-time. This value is sent to a process controller (24) to compare with a pre-set value. If there is some difference between the measured and pre-set values, the process controller (24) will generate a signal to the laser controller (part of laser (10)), which modifies the laser output (11). As a result closed loop control is achieved.

Figure 3B:
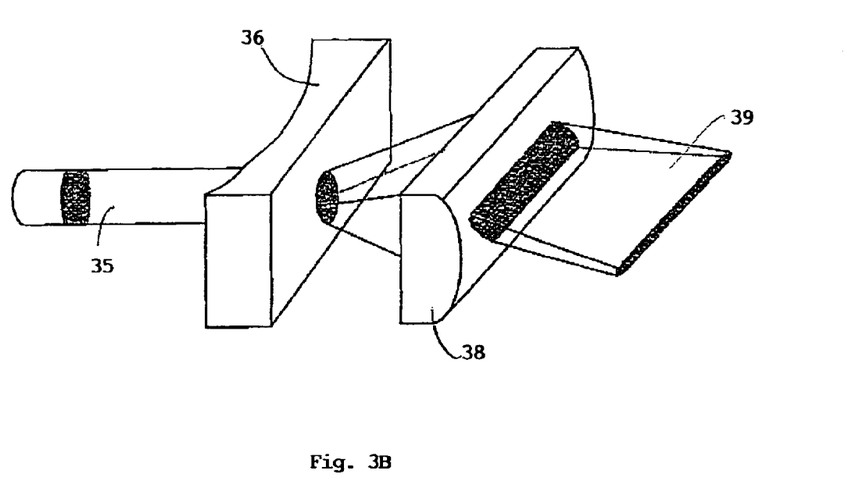
FIG. 3B is a perspective view of the lens system of the invention.

The remainder (95%) of the laser energy is transmitted by sampler (12) and passes through a lens system (16) including two cylinder lenses, which adjusts the laser beam size, shape and fluence on the flexible circuit (34). The lens system is shown in more detail in FIG. 3B. A first, plano-concave lens (36) and second plano-convex lens (38) transform the incoming circular beam (35) into a beam (39) having an elongate elliptical cross section, and adjustment of the lens positions and the focal lengths will further adjust the laser beam size, shape and fluence on the flexible circuit allowing control of the laser fluence in particular within the region from the cleaning threshold (i.e. the fluence threshold at which ablation begins to take place) to the substrate damage threshold (i.e. the upper laser fluence limit). As a result the system can be adjusted to ensure contamination removal without substrate damage. As discussed in more detail below, the laser beam, irradiating the flexible circuit (34) thus has a decontaminating effect.

The surface contamination on flexible circuit (34) has a thickness of about 10 $\mu$m. With the proper control of processing parameters (in the preferred embodiment a laser fluence of 50 mJ/cm$^2$ and pulse number of 10 for the above mentioned Nd:YAG laser are found to achieve good results), the contamination can be easily removed without any surface damage to the circuit (34).

The laser pulse is scanned across the circuit (34) by a scanner such as a galvanometer (18). The type of galvanometer is well known and is not shown in detail here, but in brief summary the galvanometer includes a pair of mirrors and corresponding motor drives, one mirror being movable along the Y axis and the other along the X axis allowing fast scanning of the laser beam in two dimensions. Controlled by the process controller (24), this galvanometer (18) changes the laser irradiation position on the sample surface (32) to remove the contamination at different positions. The galvanometer (18) can be any appropriate reflective or transmissive element, for example moved under mechanical or piezo-electric control. After the laser irradiation of one flexible circuit, the process controller (24) sends a signal to a sample roller (30) which transports the next contaminated sample (32) to the irradiated position.

To ensure laser irradiation with high quality and effectiveness a signal diagnostics and real-time monitoring system is utilised so that the process can be controlled for removing contamination completely without surface damage. A suitable sensor (20) which is preferably a microphone to record acoustic waves and/or a photodiode to detect the plasma signal is selected to capture the relevant signal generated during the laser irradiation.

The generation of acoustic waves during laser interaction with materials is well known and is discussed in, for example, "Audible acoustic wave emission in excimer laser interaction with materials", Y. F. Lu et al, J. Appl. Phys.79 (5), Mar. 1, 1996 which also describes an appropriate apparatus for monitoring the acoustic waves produced and is incorporated therein by reference. In particular the principal source of audible acoustic waves is known to be laser ablation and it is found that acoustic wave emission disappears when a surface is completely clean.

Similarly, it is known from "laser plasma interaction at an early stage of laser ablation" Y. F. Lu et al, J. Appl. Phys. Vol. 85, No. 5 Mar. 1, 1999 that, dependent on laser fluence, a photodiode detector voltage following a laser pulse in laser ablation displays a double peak profile in the time domain. The amplitude of the peak attributable to laser ablation is dependent on the concentrations of ablated materials during the laser ablation and hence the corresponding peak voltage can be monitored to detect any drops in amplitude which will correspond to the cleaning of the surface.

Alternatively a surface pattern inspection monitor (22) including a CCD camera ensures the cleaning quality in the processing. Either sensors or CCD cameras provide information as to whether the contamination is completely removed. In addition it can be established by the same means whether there is any damage in the flexible circuit after the laser irradiation.

As discussed above, plasma is generated when the laser irradiates contaminants on the circuit and when the contaminants have been removed there will be no plasma generation and hence no acoustic wave or plasma signal such that the microphone/photodiode is simply set to indicate when the detected signal falls below a predetermined threshold. The CCD camera can be used either independently or for the purposes of confirming-simply by detecting contaminants by colour checking for black matter for example—whether there is cleanliness. In addition to this, if the substrate is damaged by the laser irradiation, a further steady acoustic wave/plasma signal is created with a pulse number increase which is detected by the microphone or photodiode allowing an additional check for damage of the substrate.

Figure 4:
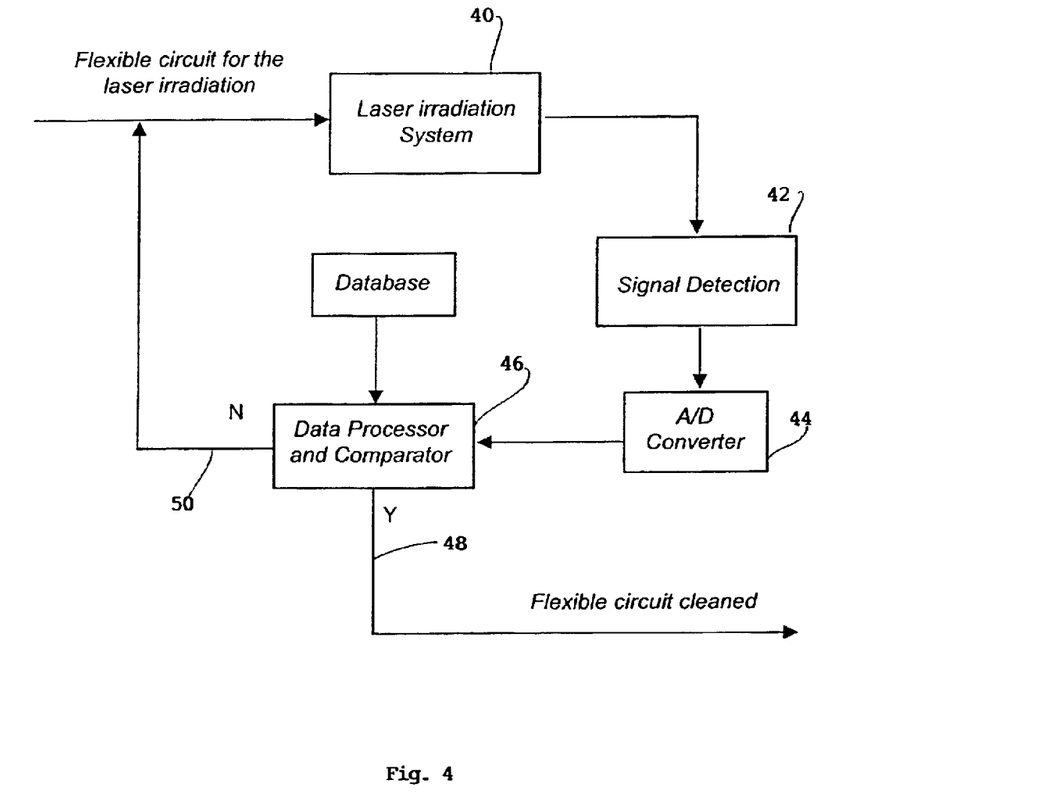
FIG. 4 is a schematic diagram of a control system of the present invention.

FIG. 4 shows the signal diagnostics and real-time monitoring system for the laser irradiation of the contamination on the flexible circuit. Sensor (20) preferably comprises a wide-band microphone or photodiode, used to detect the acoustic wave or plasma signal generated during the laser irradiation. It is found that the signal includes characteristic portions which disappear after the contamination complete removal. In this system, the captured signal from the system (40) is sensed at step (42), digitised at step (44) by an A/D converter and then its characteristic value (for example, peak amplitude or intensity) is compared with the database setting at step (46) so as to judge whether the laser irradiation is completed. This is achieved by signal recognition and comparison to identify the pre-determined characteristic portions according to any appropriate known system If the contamination is completely removed at step (48), the laser processing will be changed to the next sample. Otherwise at step (50), a further laser pulse regime will be applied for the further irradiation and the steps repeated until the surface contamination is completely removed.

In the alternative system, or a complimentary system, where a surface pattern inspection monitor (22) is used, known image recognition techniques are applied.

Returning to FIG. 3A, during the laser irradiation, the surface contamination becomes debris ejected out of the irradiation area. However, the contamination debris may re-deposit on the sample (32) surface and re-contaminate the flexible circuit (34). Therefore, it is very important to take away the contamination debris before it returns to the flexible circuit during the laser processing. Accordingly a gas stream or sucker system (28) comprising, for example, a gas stream or vacuum source is included in this invention. With the proper control of gas or vacuum nozzle position and size and gas or vacuum flow rate, the contamination debris can be easily transported or sucked away.

In the system setup, the flexible circuit (34) is face down and irradiated by the pulsed laser (10). With this design, the flexible circuit recontamination by the contamination debris is yet further lessened simply due to gravitational attraction on the debris. However, a small proportion of the debris may escape the gas stream and drop onto the optics, affecting the processing performance. Accordingly, a protective glass surface (26) is included between the flexible circuit (34) and the optics system. With this design, the small amount of debris can be scrubbed away by the operator after a certain period of the manufacturing time.

Figure 5:
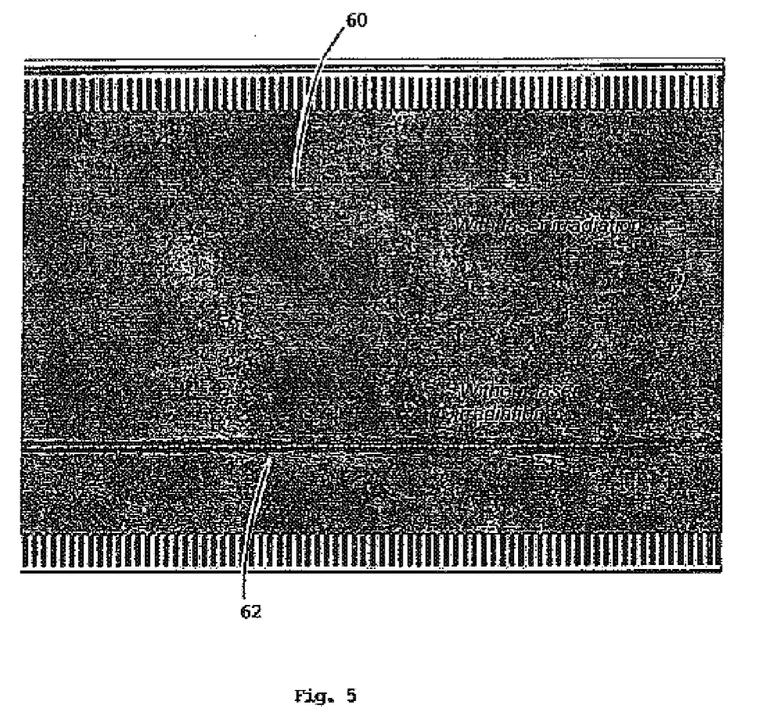
FIG. 5 is an image demonstrating the cleaning effect according to the present invention.
Figure 6:
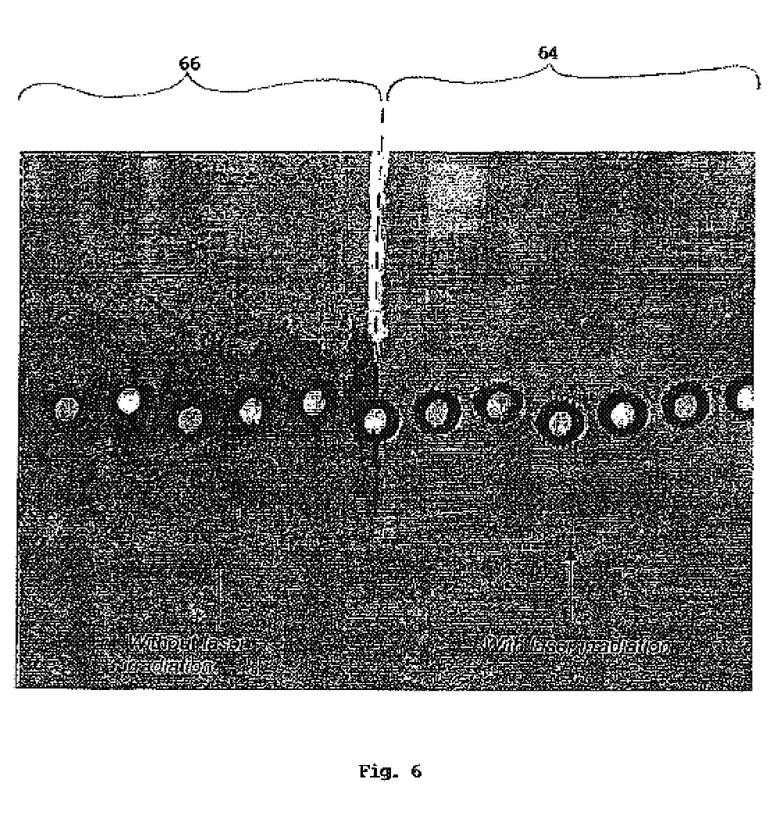
FIG. 6 is a magnified image showing the cleaning effects of the present invention.

FIGS. 5 and 6 demonstrate the effectiveness of the laser irradiation system to remove the surface contamination on the flexible circuit (34).

FIG. 5 shows a microscopic photograph of the flexible circuit surface with (line 60) and without (line 62) the laser irradiation. It can be observed from line (60) that the dark line contamination is completely removed after the laser irradiation. FIG. 6 shows a magnified photograph of the flexible circuit surface with region (64) and without region (66) the laser irradiation. It can be observed that the contamination around and inside the tiny inkjet nozzles is completely removed after the laser irradiation. A clean substrate surface without any damage can be observed on the flexible circuit.

It will be appreciated that any appropriate type of laser can be used and any particular power, wavelength, duration and pulse number is only one preferred possibility. Similarly a range of types of inkjet circuit substrate and contaminants can be accommodated according to the invention.

Explanation of Symbols

1 Contamination area
2 Contamination area
3 Dark contamination zone
4 Inkjet nozzles
10 Laser source
11 Laser beam
12 Laser beam sampler
14 Laser energy meter
16 Lens system
18 Galvanometer
20 Signal diagnostics & real-time monitoring system
22 CCD camera
24 Process controller
26 Protection glass
28 Gas stream or sucker system
30 Sample roller
32 Sample for ablation
34 Flexible circuit
35 Incoming circular beam
36 Cylinder plano-concave lens
38 Cylinder plano-convex lens
39 Elongated laser beam
40 Laser irradiation system
42 Signal detection step
44 A/D converter
46 Data processor and comparator
48 "Contamination removed" step
50 "Contamination remains" step
60 Irradiated line
62 Non-irradiated line
64 Irradiated region
66 Non-irradiated region

What is claimed is:

1. An Inkjet cleaning apparatus comprising a circuit holder, a laser for generating a laser beam, an optics subsystem arranged to focus and scan the laser beam onto a circuit surface at the circuit holder, and a diagnostic subsystem comprising a sensor arranged to sense whether the circuit surface has been cleaned.

2. An apparatus as claimed in claim 1 in which the optics subsystem includes a beam splitter for splitting off a portion of the beam to regulate the laser beam power.

3. An apparatus as claimed in claim 1 in which the optics subsystem includes a scanner arranged to scan the laser beam across a circuit surface.

4. An apparatus as claimed in claim 1 in which the optics subsystem includes a lens system for adjusting laser beam size, shape and incident fluence.

5. An apparatus as claimed in claim 1 in which the sensor comprises one or more of an acoustic sensor, a plasma signal sensor, or a surface pattern inspection monitor.

6. An apparatus as claimed in claim 1 further including an apparatus controller arranged to receive a signal from the sensor and control the cleaning operation accordingly.

7. An apparatus as claimed in claim 1 in which the laser has a pulse duration of nanoseconds scale and a wavelength selected from the visible to the infrared range.

8. An apparatus as claimed in claim 1 in which the circuit holder is arranged to replace a cleaned circuit by a contaminated circuit.

9. An apparatus as claimed in claim 1 further including a contaminant removal mechanism.

10. An apparatus as claimed in claim 9 in which the contaminant removal mechanism comprises one of a vacuum source or a gas stream source.

11. An apparatus as claimed in claim 9 further comprising a transparent protective cover between the circuit holder and the optics system to trap escaped contaminant.

12. An apparatus as claimed in claim 1 in which the inkjet circuit comprises one or more inkjet nozzles formed in a flexible circuit substrate.

13. A method of cleaning an inkjet circuit comprising the steps of retaining a circuit to be cleaned in a circuit holder, generating a laser beam from a laser, focusing and scanning the laser beam on the circuit surface via an optics subsystem, and detecting when a portion of the circuit surface is cleaned and controlling a galvanometer to scan the beam across a non-cleaned portion of the surface.

14. A method as claimed in claim 13 further comprising the step of detecting when a circuit is fully cleaned, and controlling the circuit holder to replace the circuit with a non-cleaned circuit.

15. A method as claimed in claim 13 for cleaning one or more inkjet nozzles formed in a flexible circuit substrate.

16. An inkjet cleaning apparatus comprising a circuit holder, a laser for generating a laser beam, and an optics subsystem arranged to focus and scan the laser beam onto a circuit surface at the circuit holder, and wherein the circuit holder is arranged to replace a cleaned circuit by a contaminated circuit.

17. An apparatus as claimed in claim 16 in which the optics subsystem includes a beam splitter for splitting off a portion of the beam to regulate the laser beam power.

18. An apparatus as claimed in claim 16 in which the optics subsystem includes a scanner arranged to scan the laser beam across a circuit surface.

19. An apparatus as claimed in claim 16 in which the optics subsystem includes a lens system for adjusting laser beam size, shape and incident fluence.

20. An apparatus as claimed in claim 16 further including a diagnostic subsystem comprising a sensor arranged to sense whether the circuit surface has been cleaned.

21. An apparatus as claimed in claim 20 in which the sensor comprises one or more of an acoustic sensor, a plasma signal sensor, or a surface pattern inspection monitor.

22. An apparatus as claimed in claim 20 further including an apparatus controller arranged to receive a signal from the sensor and control the cleaning operation accordingly.

23. An apparatus as claimed in claim 16 in which the laser has a pulse duration of nanoseconds scale and a wavelength selected from the visible to the infrared range.

24. An apparatus as claimed in claim 16 further including a contaminant removal mechanism.

25. An apparatus as claimed in claim 24 in which the contaminant removal mechanism comprises one of a vacuum source or a gas stream source.

26. An apparatus as claimed in claim 24 further comprising a transparent protective cover between the circuit holder and the optics system to trap escaped contaminant.

27. An apparatus as claimed in claim 16 in which the inkjet circuit comprises one or more inkjet nozzles formed in a flexible circuit substrate.

28. A method of cleaning an inkjet circuit comprising the steps of retaining a circuit to be cleaned in a circuit holder, generating a laser beam from a laser, focusing and scanning the laser beam on the circuit surface via an optics subsystem, detecting when a circuit is fully cleaned, and controlling the circuit holder to replace the circuit with a non-cleaned circuit.

29. A method as claimed in claim 28 further comprising the steps of detecting when a portion of the circuit surface is cleaned and controlling a galvanometer to scan the beam across a non-cleaned portion of the surface.

30. A method as claimed in claim 28 for cleaning one or more inkjet nozzles formed in a flexible circuit substrate.

* * * * *